US012700456B2

(12) United States Patent
Ning et al.

(10) Patent No.: US 12,700,456 B2
(45) Date of Patent: Aug. 4, 2026

(54) CONTROLLING PILLAR VOLTAGE USING WORDLINE BOOST VOLTAGE AND SELECT GATE LEAKAGE DURING ALL LEVELS PROGRAMMING OF A MEMORY DEVICE

(71) Applicant: Micron Technology, Inc., Boise, ID (US)

(72) Inventors: Sheyang Ning, San Jose, CA (US); Lawrence Celso Miranda, San Jose, CA (US); Jeffrey S. McNeil, Nampa, ID (US); Tomoko Ogura Iwasaki, San Jose, CA (US); Yeang Meng Hern, Singapore (SG); Lee-eun Yu, San Jose, CA (US); Albert Fayrushin, Boise, ID (US); Fulvio Rori, Boise, ID (US); Justin Bates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 18/625,800

(22) Filed: Apr. 3, 2024

(65) Prior Publication Data

US 2024/0339158 A1     Oct. 10, 2024

Related U.S. Application Data

(60) Provisional application No. 63/457,573, filed on Apr. 6, 2023.

(51) Int. Cl.
| | |
|---|---|
| *G11C 16/08* | (2006.01) |
| *G11C 16/04* | (2006.01) |
| *G11C 16/10* | (2006.01) |

(52) U.S. Cl.
CPC .......... *G11C 16/08* (2013.01); *G11C 16/0483* (2013.01); *G11C 16/10* (2013.01)

(58) Field of Classification Search
CPC ...... G11C 16/08; G11C 16/0483; G11C 16/10
USPC ..................................................... 365/185.23
See application file for complete search history.

(56) References Cited

U.S. PATENT DOCUMENTS

| | | | |
|---|---|---|---|
| 2017/0117049 A1* | 4/2017 | Rajwade ................ | G11C 16/16 |
| 2022/0310167 A1* | 9/2022 | Ning ..................... | G11C 16/24 |

* cited by examiner

*Primary Examiner* — Amir Zarabian
*Assistant Examiner* — Daniel John King
(74) *Attorney, Agent, or Firm* — Lowenstein Sandler LLP

(57) ABSTRACT

Control logic in a memory device initiates a program operation including a first phase including applying a ramping voltage level to a set of wordlines of a memory device to boost a set of pillar voltages and a second phase including applying a set of programming pulses to a wordline associated with one or more memory cells of the memory device to be programmed to a set of programming levels, wherein each programming level of the set of programming levels is programmed by each programming pulse. During the first phase of the program operation, a first voltage applied to a drain-side select line (SGD) is adjusted from a first SGD voltage level to a second SGD voltage level.

20 Claims, 11 Drawing Sheets

Figure 3:
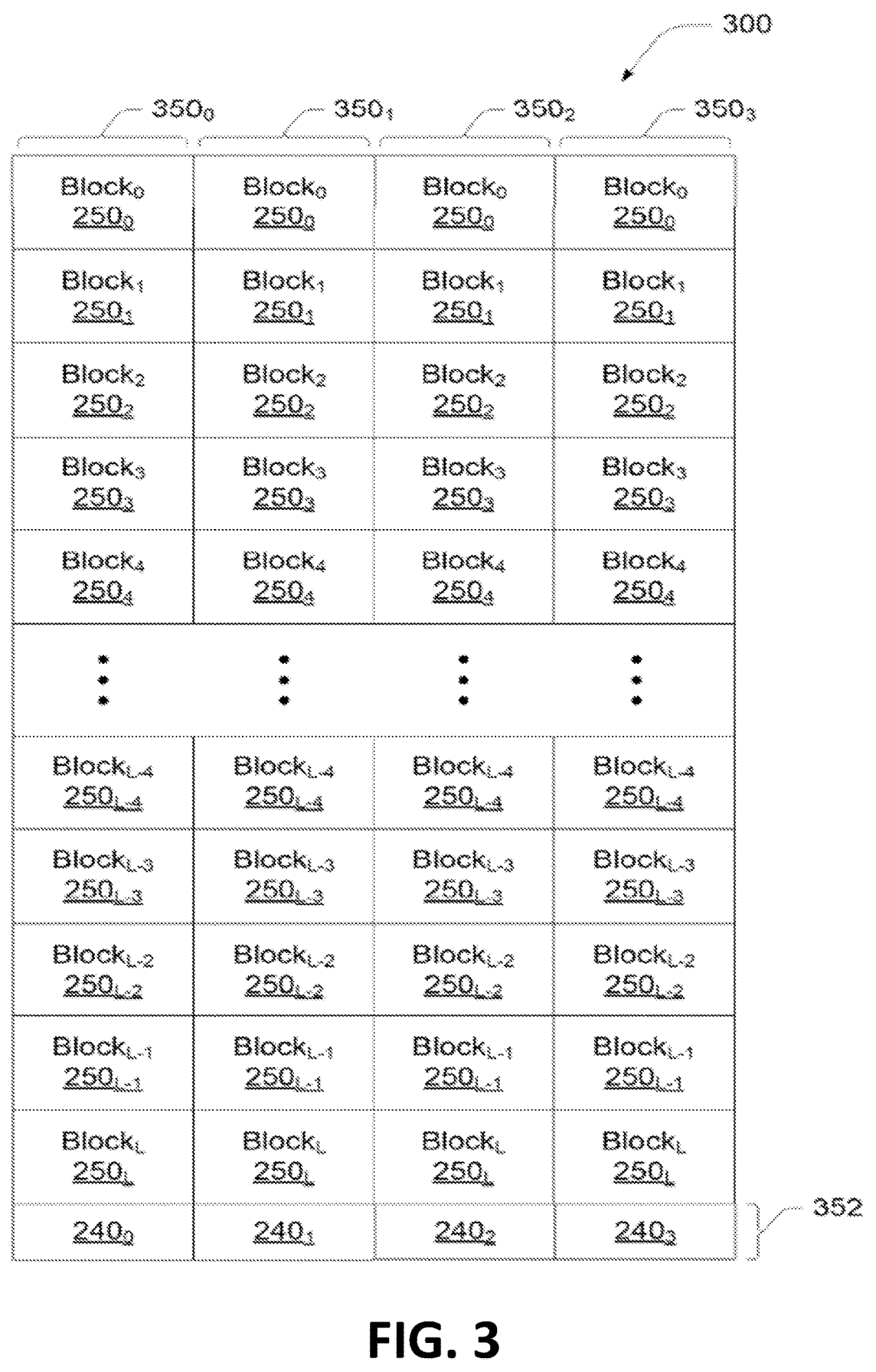

300

| $350_0$ | $350_1$ | $350_2$ | $350_3$ |
|---|---|---|---|
| Block$_0$ 250$_0$ | Block$_0$ 250$_0$ | Block$_0$ 250$_0$ | Block$_0$ 250$_0$ |
| Block$_1$ 250$_1$ | Block$_1$ 250$_1$ | Block$_1$ 250$_1$ | Block$_1$ 250$_1$ |
| Block$_2$ 250$_2$ | Block$_2$ 250$_2$ | Block$_2$ 250$_2$ | Block$_2$ 250$_2$ |
| Block$_3$ 250$_3$ | Block$_3$ 250$_3$ | Block$_3$ 250$_3$ | Block$_3$ 250$_3$ |
| Block$_4$ 250$_4$ | Block$_4$ 250$_4$ | Block$_4$ 250$_4$ | Block$_4$ 250$_4$ |
| ⋮ | ⋮ | ⋮ | ⋮ |
| Block$_{L-4}$ 250$_{L-4}$ | Block$_{L-4}$ 250$_{L-4}$ | Block$_{L-4}$ 250$_{L-4}$ | Block$_{L-4}$ 250$_{L-4}$ |
| Block$_{L-3}$ 250$_{L-3}$ | Block$_{L-3}$ 250$_{L-3}$ | Block$_{L-3}$ 250$_{L-3}$ | Block$_{L-3}$ 250$_{L-3}$ |
| Block$_{L-2}$ 250$_{L-2}$ | Block$_{L-2}$ 250$_{L-2}$ | Block$_{L-2}$ 250$_{L-2}$ | Block$_{L-2}$ 250$_{L-2}$ |
| Block$_{L-1}$ 250$_{L-1}$ | Block$_{L-1}$ 250$_{L-1}$ | Block$_{L-1}$ 250$_{L-1}$ | Block$_{L-1}$ 250$_{L-1}$ |
| Block$_L$ 250$_L$ | Block$_L$ 250$_L$ | Block$_L$ 250$_L$ | Block$_L$ 250$_L$ |
| 240$_0$ | 240$_1$ | 240$_2$ | 240$_3$ |

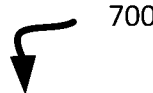

700

Initiate a programming operation a program operation including a first phase including applying a ramping voltage level to a set of wordlines of a memory device to boost a set of pillar voltages and a second phase including applying a set of programming pulses to a wordline associated with one or more memory cells of the memory device to be programmed to a set of programming levels, wherein each programming level of the set of programming levels is programmed by each programming pulse
710

During the first phase of the program operation, adjust a first voltage applied to a drain-side select line (SGD) from a first SGD voltage level to a second SGD voltage level
720

CONTROLLING PILLAR VOLTAGE USING WORDLINE BOOST VOLTAGE AND SELECT GATE LEAKAGE DURING ALL LEVELS PROGRAMMING OF A MEMORY DEVICE

CROSS-REFERENCE TO RELATED APPLICATION

This application claims the benefit of U.S. Provisional Application No. 63/457,573, titled "Controlling Pillar Voltage Using Wordline Boost Voltage and Select Gate Leakage During All Levels Programming of a Memory Device," filed Apr. 6, 2023, which is hereby incorporated herein by reference in its entirety.

TECHNICAL FIELD

Embodiments of the disclosure relate generally to memory sub-systems, and more specifically, relate to controlling pillar voltage using wordline boost voltage and select gate leakage during all levels programming of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a block schematic of a portion of an array of memory cells as could be used in a memory of the type described with reference to FIG. 1B, in accordance with one or more embodiments of the present disclosure.

FIG. 6 illustrates example programming pulse waveforms corresponding to a voltage-adjusted all levels programming of a memory device in a memory sub-system, in accordance with one or more embodiments of the present disclosure.

FIG. 7 is a flow diagram of an example method of a voltage-adjusted all levels programming of a memory device in a memory sub-system, in accordance with one or more embodiments of the present disclosure.

DETAILED DESCRIPTION

Figure 1A:
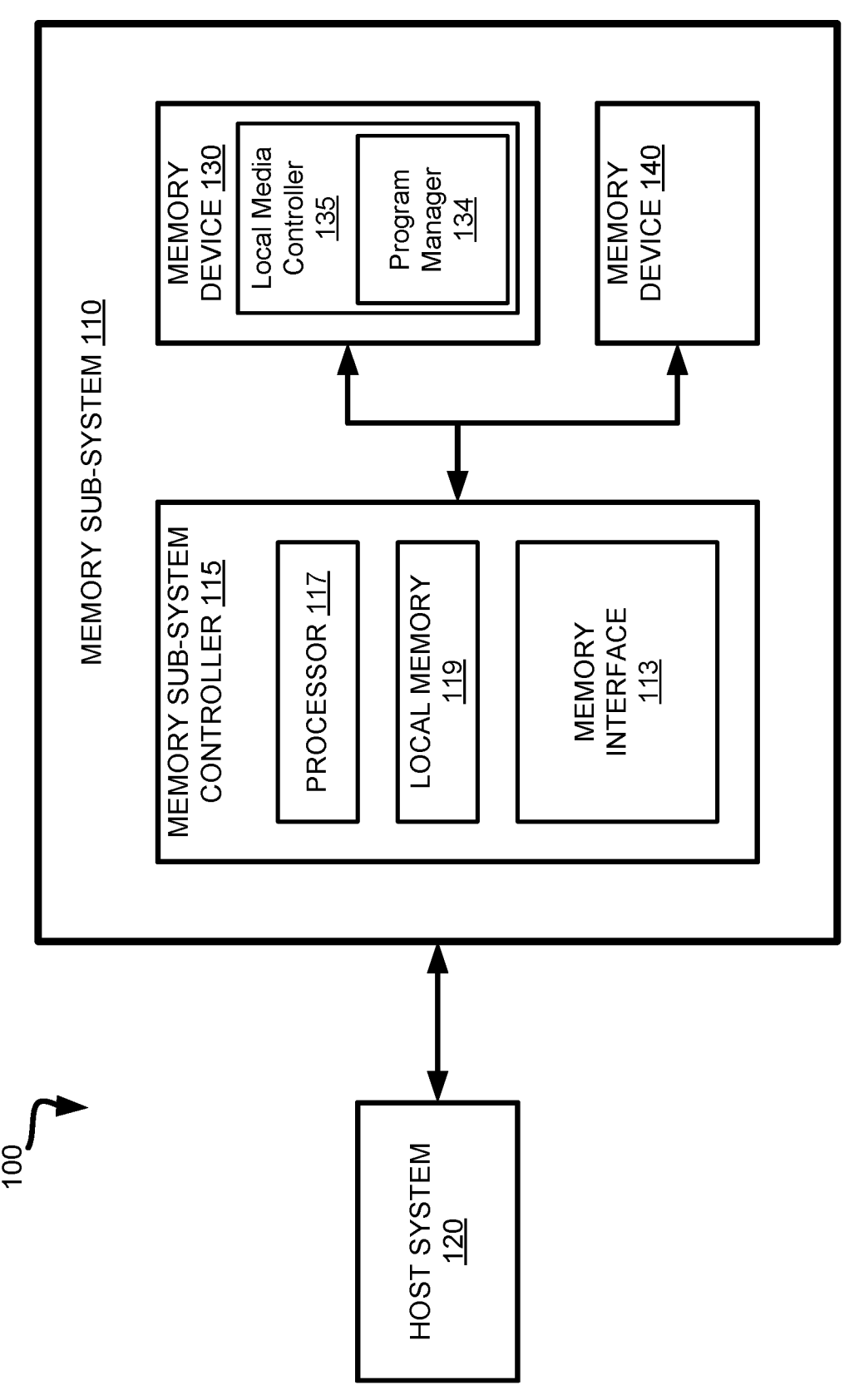
FIG. 1A illustrates an example computing system that includes a memory sub-system, in accordance with one or more embodiments of the present disclosure.

Aspects of the present disclosure are directed to controlling pillar voltage using wordline boost voltage and select gate leakage during all levels programming of a memory device in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Memory cells are formed etched on a silicon wafer in an array of columns (also hereinafter referred to as "bitlines") and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A block hereinafter refers to a unit of the memory device used to store data and can include a group of memory cells, a wordline group, a wordline, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) often fabricated in common with the memory cells, so as to form an array of strings in a block of memory (e.g., a memory array). The compact nature of certain non-volatile memory devices, such as 3D flash NAND memory, means wordlines are common to many memory cells within a block of memory. Some memory devices use certain types of memory cells, such as triple-level cell (TLC) memory cells, which store three bits of data in each memory cell, which make it affordable to move more applications from legacy hard disk drives to newer memory sub-systems, such as NAND solid-state drives (SSDs).

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cells can be programmed with the application of a programming voltage to a selected wordline. In one approach, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., where the magnitude of subsequent pulses are increased by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

The series of incrementing voltage programming pulses are applied to the selected wordline to increase a charge level, and thereby a threshold voltage, of each memory cell connected to that wordline. After each programming pulse, or after a number of programming pulses, a program verify operation is performed to determine if the threshold voltage of the one or more memory cells has increased to a desired programming level (e.g., a stored target threshold voltage corresponding to a programming level). A program verify operation can include storing a target threshold voltage in a page buffer that is coupled to each data line (e.g., bitline) and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare if the present threshold voltage is greater than or equal to the stored target threshold voltage. If the present threshold voltage is greater than or equal to the target threshold voltage, further programming is inhibited.

During programming, the sequence of programming pulses can be incrementally increased in value (e.g., by a step voltage value such as 0.33V) to increase a charge stored on a charge storage structure corresponding to each pulse. The memory device can reach a target programming level voltage for a particular programming level by incrementally storing or increasing amounts of charge corresponding to the programming step voltage.

An all levels programming algorithm may be implemented to program memory cells of a memory device in a memory sub-system. According to the all levels programming, rather than sequentially programming the multiple programming levels (e.g., levels L1 to L7 of a TLC memory cell), each programming pulse programs all of the levels together. The all levels programming operation may be executed to enable each programming pulse to program all of the levels of a selected wordline. The all levels programming operation includes a first phase wherein an increasing or ramping wordline voltage (e.g., a voltage applied to one or more wordlines that is periodically ramped or increased by a step voltage amount) is applied to a set of wordlines of the memory array (e.g., the selected wordline and one or more unselected wordlines). During the first phase, respective pillars (e.g., vertical conductive traces) corresponding to programming levels (e.g., L1 to L7 for a TLC memory device) are floated (e.g., disconnected from both a voltage supply and a ground). A set of pillars corresponding to different programming levels are floated in sequence during the first phase (e.g., a first pillar corresponding to L1 is floated at a first time, a second pillar corresponding to L2 is floated at a second time, and so on).

A pillar can be floated by turning both a drain-side select gate line (SGD) and a source-side select gate line (SGS)) off (e.g., a selected SGD is toggled from a high voltage level (Vsgd_high) to approximately 0V to prevent a corresponding bitline from discharging to the corresponding pillar). A bitline corresponding to the first pillar associated with the programming level L1 is toggled from approximately 0V to a high voltage level (Vbl_high) to ensure the pillar remains floating during the remainder of the first phase (e.g., application of the ramping wordline voltage).

Once a pillar is floated, a voltage of each pillar can be boosted or increased in accordance with a step or increase of the ramping wordline voltage. At the end of the first phase, the pillar voltage levels (Vpillar) are boosted to different voltage levels (e.g., Vpillar for programming level L1 is boosted to a highest value, Vpillar for programming level L2 is boosted to a next highest value and so on).

The all levels programming operation includes a second phase where a programming pulse is applied to the target wordline. The programming pulse is applied to program all of the programming levels (e.g., L1 to L7 for a TLC memory device). The first phase and the second phase can be iteratively performed such that multiple programming pulses are applied (e.g., programming pulses 1 through N) until the levels have been programmed and verified. Each iteration of the second phase of the programming operation includes the application of a programming pulse, where each programming pulse programs all of the programming levels together.

In some systems, the all levels programming operation is executed using a drain-to-source programming sequence. When using a drain-to-source programming sequence, data for programming memory cells associated with a selected wordline is provided via the drain-side bitline. For example, the bitline may be supplied with a ground voltage (e.g., approximately 0V) to enable the data to be transmitted to the selected wordline. However, in the drain-to-source programming scheme, the path between the bitline and the selected wordline can be blocked by memory cells that are already programmed. In order to inhibit programming of those memory cells, a first pass through or inhibit voltage (Vpass) is needed is needed that is higher than the corresponding threshold voltage of the programmed cells. For example, a first Vpass of approximately 4.5V may be need to turn on the drain-side channels before boosting the wordlines during the first phase of the all levels programming operation. Use of a high first Vpass level can result in a final Vpass of greater than approximately 10V. This results in the need for a large number of wordline boost increments (e.g., six or seven wordline step-ups or increases of approximately 1V each) to tune the pillar potential for each data level during the first phase of the all levels programming operation. The higher starting Vpass level together with the incremental step-ups of the wordline voltage results in a high final Vpass level (e.g., greater than approximately 10V), which causes a program disturb and erase state loss. In particular, the high final Vpass level causes the undesirable drifting of the upper tail of the erase distribution toward the lower tail of the first programming level (L1).

Furthermore, during the all levels programming operation, the bitline voltage may be charged to a high voltage level before programming to adjust the pillar potential (Vpillar). However, the boosting of the pillar voltage to a level greater than 0V during the programming phase causes an increase to the maximum program voltage level (Vpgm-max). For example, when the bitline corresponding to a last programming level (e.g., L7) is raised from 0V to a high voltage level (e.g., Vbl_high), there is leakage from the bitline to the L7 pillar (e.g., approximately 0.6V). Accordingly, during the all levels programming operation, the L7 pillar has a voltage (e.g., approximately 0.6V) due to the bitline leakage, instead of 0V as in a typical incremental step pulse program (ISPP) operation. In view of the L7 pillar voltage, the wordline voltage is increased by an amount equivalent to the leakage voltage level (e.g., approximately 0.6V) to maintain a same level of stress on the memory cells of the L7 pillar. Accordingly, the L7 pillar voltage experienced in the all levels programming operation due to bitline leakage results in an increase of the maximum program voltage (e.g., approximately a 0.6V increase of Vpgm-max).

According to aspects of the present disclosure, an all levels programming operation is executed with control of pillar potential levels (Vpillar) during a first phase of the all levels programming by adjustment one or more select gate voltages to control and reduce a final pass through voltage level (Vpass-final). Advantageously, the adjustment of the one or more select gate voltages (e.g., one or more of a drain-side select gate line (SGD) or a source-side select gate line (SGS)) provides for a reduction in the Vpass-final, which reduces the program disturb associated with the all levels programming operation. According to embodiments, one or both of the SGD voltage (Vsgd) or the SGS voltage (Vsgs) can be adjusted (e.g., reduced) to adjusted level (Vsgd_adjusted and Vsgs_adjusted) to control the amount of bitline voltage leaks to the pillar channel, which enables a reduction of the program disturb.

In an embodiment, during the first phase of the all levels programming operation, the pillar potential levels (Vpillar) can be further controlled by adjusting the wordline boost voltage to control and reduce a maximum program voltage level (Vpgm-max). In this embodiment, while one or more of the select gate voltages (e.g., Vsgd, Vsgs, or both) are adjusted to an adjusted level (e.g., Vsgd_adjusted or Vsgs_adjusted) during the first phase of an all levels programming operation (i.e., the phase during which the pillar potentials are boosted) the wordline boost for a next to last programming level (e.g., L6 for a TLC memory device) is removed. Accordingly, the incremental increase of the wordline voltage boost is applied for levels L1 to L5, with no are floated (e.g., disconnected from both a voltage supply and a ground). A set of pillars corresponding to different programming levels are floated in sequence during the first phase (e.g., a first pillar corresponding to L1 is floated at a first time, a second pillar corresponding to L2 is floated at a second time, and so on). Accordingly, during the boosting of L6, the wordline voltage level applied to the L6 pillar remains the same as the wordline level applied to the L5 pillar (e.g., Vboost L5). According to an embodiment, removal of the increment or step up of the wordline boost voltage (Vboost) during boosting of the L6 pillar advantageously results in a reduction in the overall or maximum program voltage level (Vpgm-max), which reduces the program disturb experienced during execution of the all levels programming operation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, compute express link (CXL) interface). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a CXL interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the one or more memory devices 130 include one or more local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how the memory cells are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, program manager 134 can receive data to be programmed to the memory device 130 (e.g., a TLC memory device). The program manager 134 can execute an all levels programming algorithm, where each of the programming pulses is used to program each of the programming levels of the memory device. In an embodiment, the all levels programming algorithm can be executed to program memory cells in the TLC portion of the memory array to all of the multiple respective programming levels (e.g., programming levels L0, L1, L2 . . . L7), wherein each programming pulse programs all of the programming levels from L1 to L7. For example, upon identifying a set of memory cells to be programmed (e.g., the memory cells associated with one or more wordlines of the memory array), program manager 134 can execute a first phase of the all levels programming operation wherein a ramping wordline voltage is applied and each pillar corresponding to the respective programming levels is floated. In an embodiment, a voltage of each pillar (Vpillar) when floated can be boosted using the ramping wordline voltage.

In an embodiment, the program manager 134 can execute a second phase of the all levels programming operation to cause a single program pulse (e.g., a set of programming pulses) to be applied to the identified set of memory cells to program those memory cells to each of the multiple respective programming levels (i.e., L1, L2, . . . L7). In an embodiment, the program manager 134 can perform a program verify operation corresponding to each programming pulse and programming level to verify whether the memory cells in the set were programmed to all of the respective programming levels. The program manager 134 can execute the first phase and the second phase (wherein each iteration of the second phase includes the application of programming pulse) until all of the programming levels have reached the corresponding target program voltage level. The program manager 134 can perform operations to establish wordline, bitline, and boost voltages to control or limit a maximum program voltage level applied during the all levels programming operation. In an embodiment, the program manager 134 executes the all levels programming operation including multiple iterations of the first phase and second phase, where each iteration of the second phase includes the application of an incrementally increasing voltage to program all of the programming levels. In an embodiment, the program manager 134 causes the programming pulses to be applied during the respective second phases of each iteration and determines the programming pulse at which the applied wordline voltage has reached an established maximum program voltage (Vpgm_max), herein referred as "programming pulse N".

Having determined that Vpgm_max has been reach at programming pulse N, in order to control or limit the programming voltage such that it does not exceed Vpgm_max during a next programming pulse (e.g., programming pulse N+1), the program manager 134 causes a wordline voltage applied, a bitline voltage associated with a last programming level (e.g., L7), and a boost voltage associated with a second to last programming level (e.g., Vpillar for L6) to be established during programming pulse N+1 to manage a maximum program voltage level applied to program the target memory cells. Further details with regards to the operations of program manager 134 are described below.

Figure 1B:
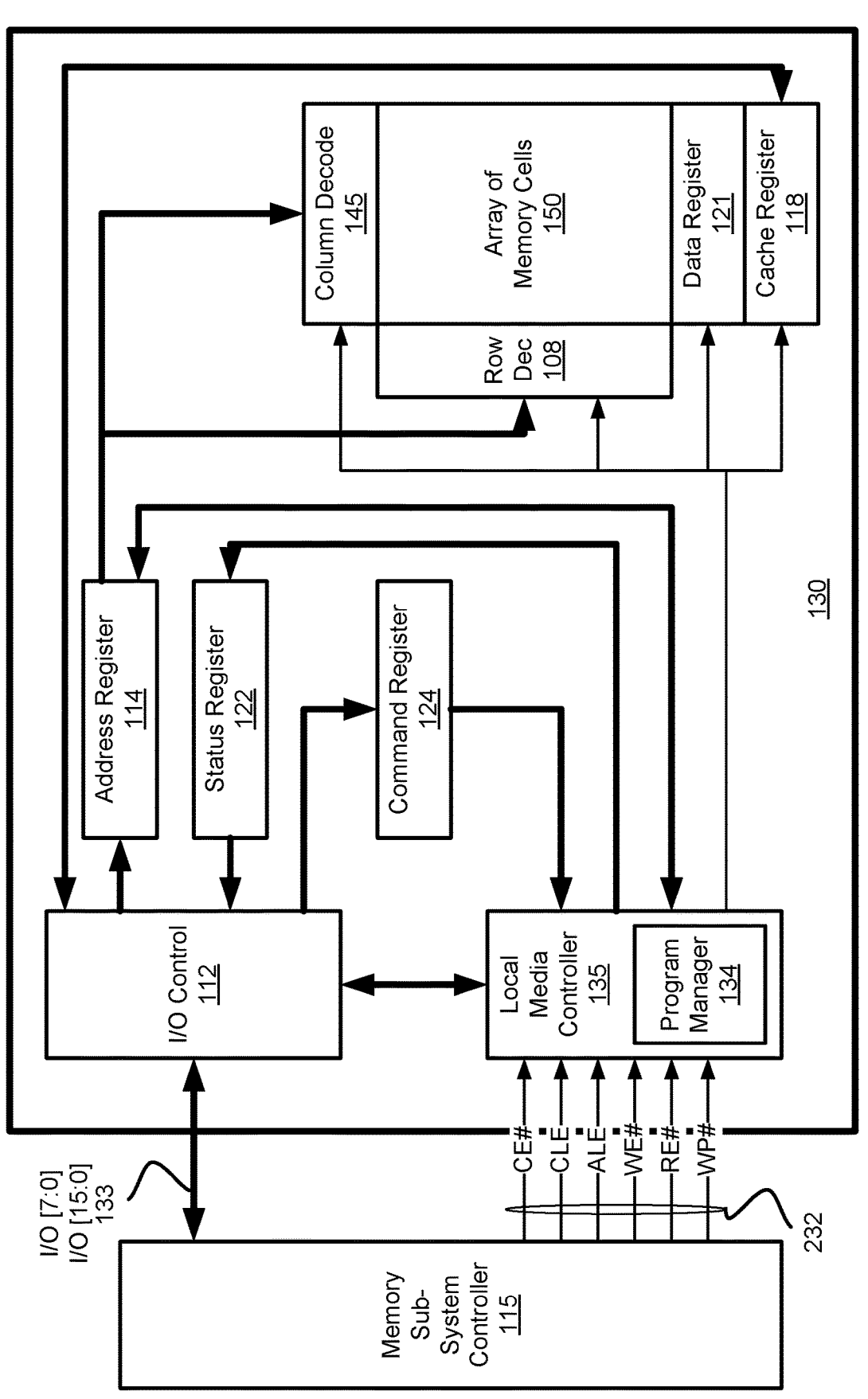
FIG. 1B is a block diagram of a memory device in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 145 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 212 and row decode circuitry 108 and column decode circuitry 145 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 145 to control the row decode circuitry 108 and column decode circuitry 145 in response to the addresses. In one embodiment, local media controller 135 includes program manager 134, which can implement the all levels programming of memory device 130 including establishing wordline, bitline and boost voltages during a last programming pulse to control or limit a maximum program voltage, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 121 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 121 to the cache register 118. The cache register 118 and/or the data register 121 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 133 and outputs data to the memory sub-system controller 115 over I/O bus 133.

For example, the commands may be received over input/output (I/O) pins [7:0] of I/O bus 133 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 121 for programming the array of memory cells 150.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
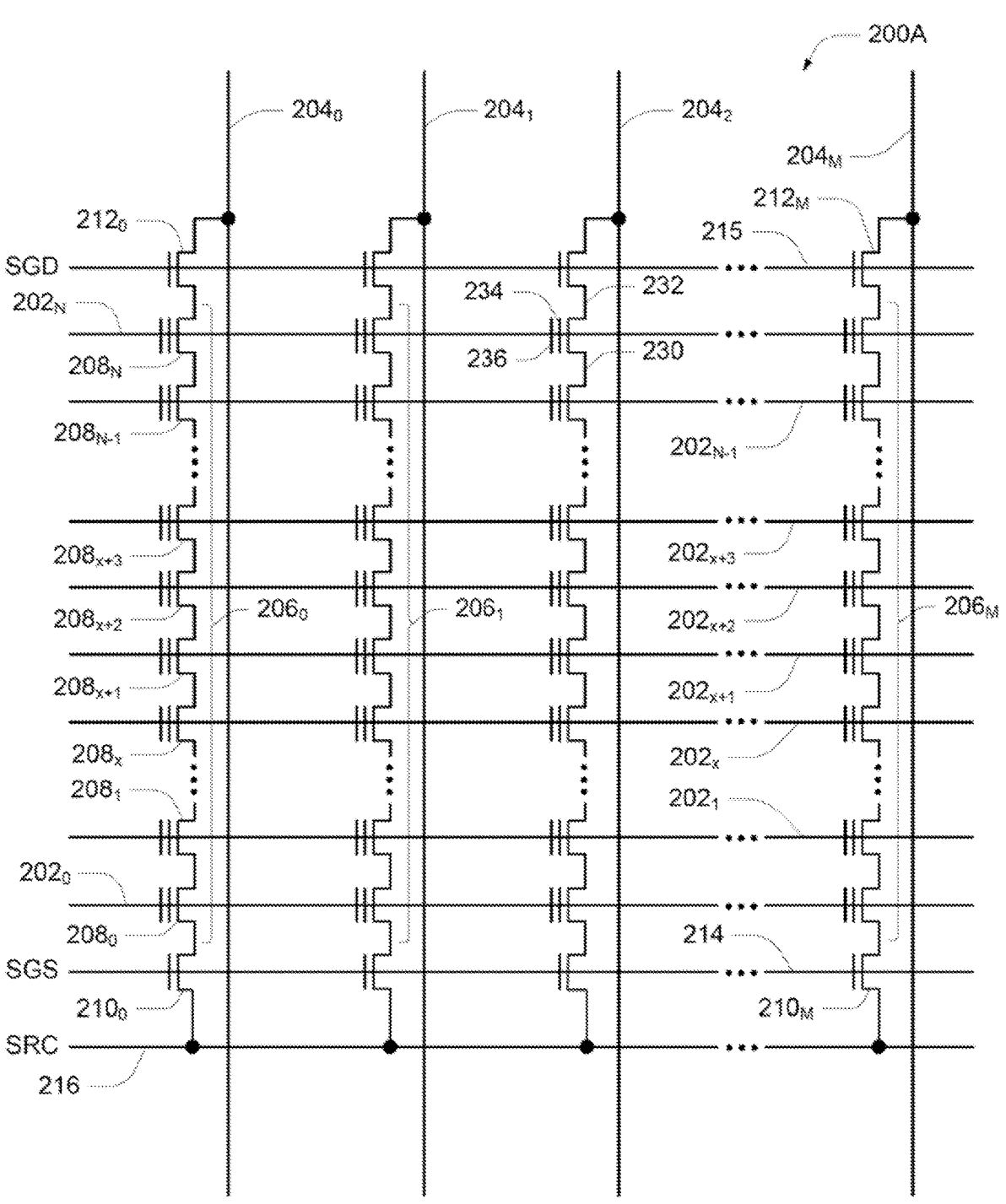
FIG. 2A-2C are schematics of portions of an array of memory cells as could be used in a memory of the type described with reference to FIG. 1B, in accordance with one or more embodiments of the present disclosure.
Figure 2B:
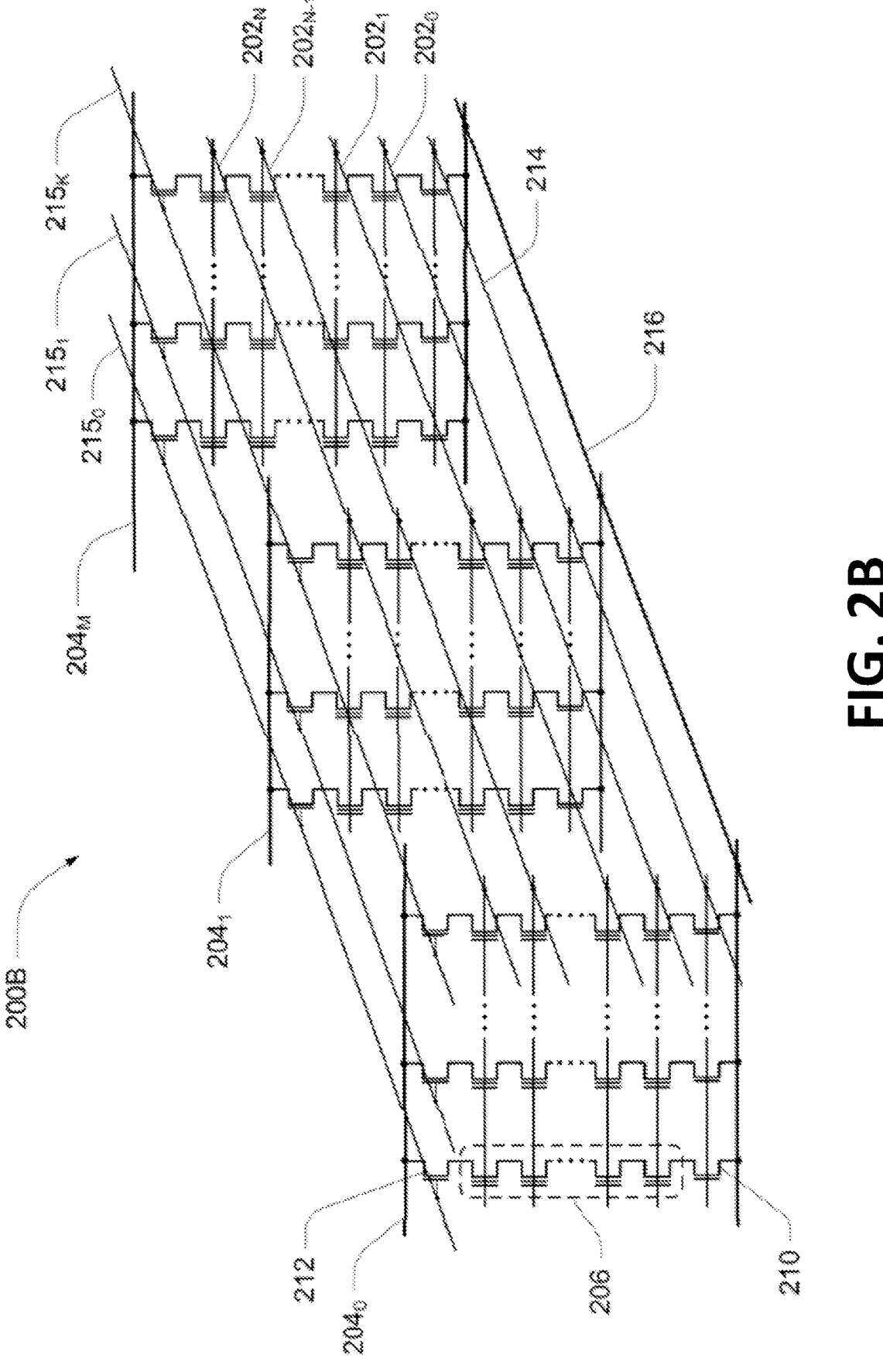
Figure 2C:
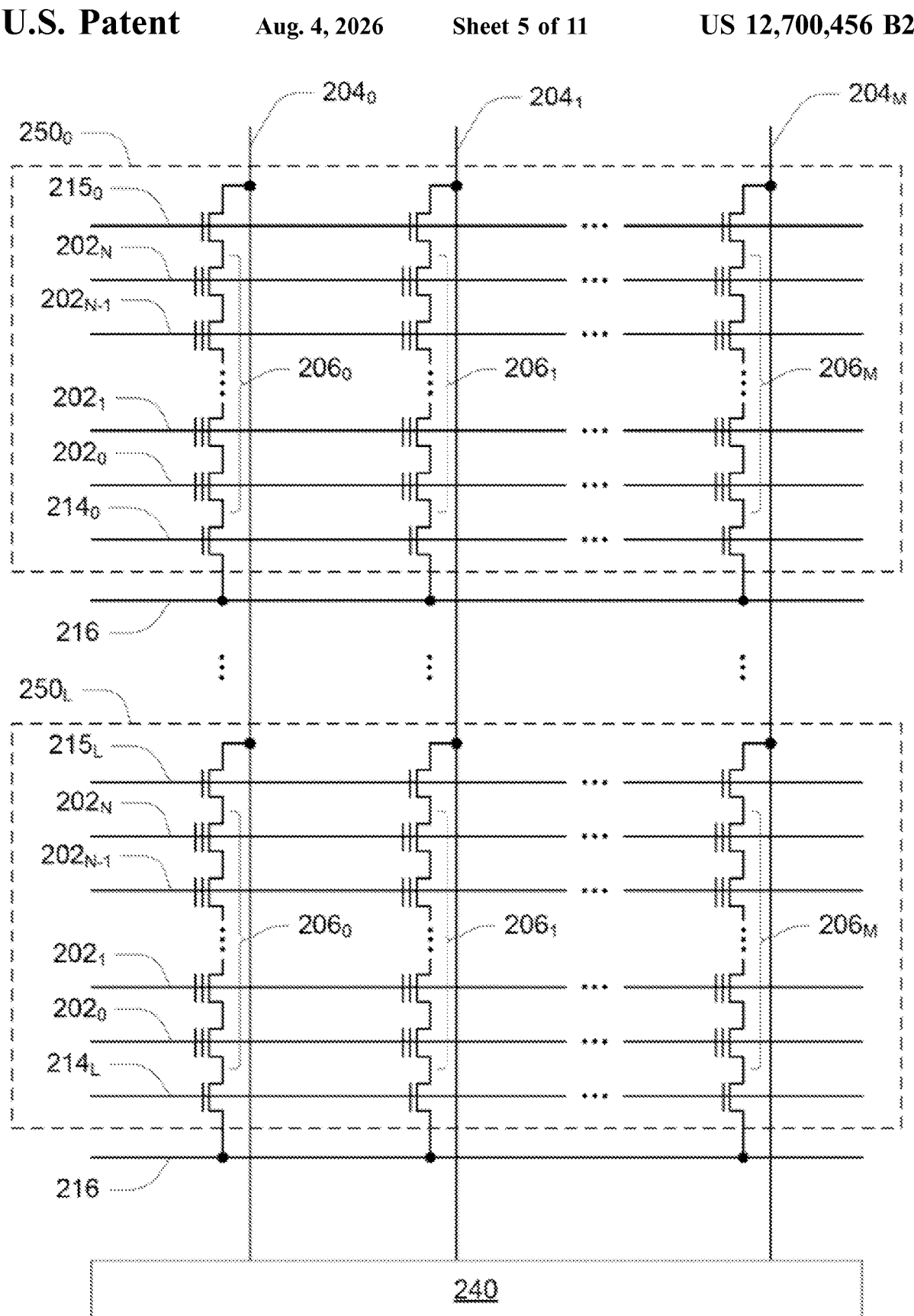

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source-side select gate line (SGS), and select gates $212_0$ to $212_M$ can be commonly connected to a select line 215, such as a drain-side select gate line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain)

and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
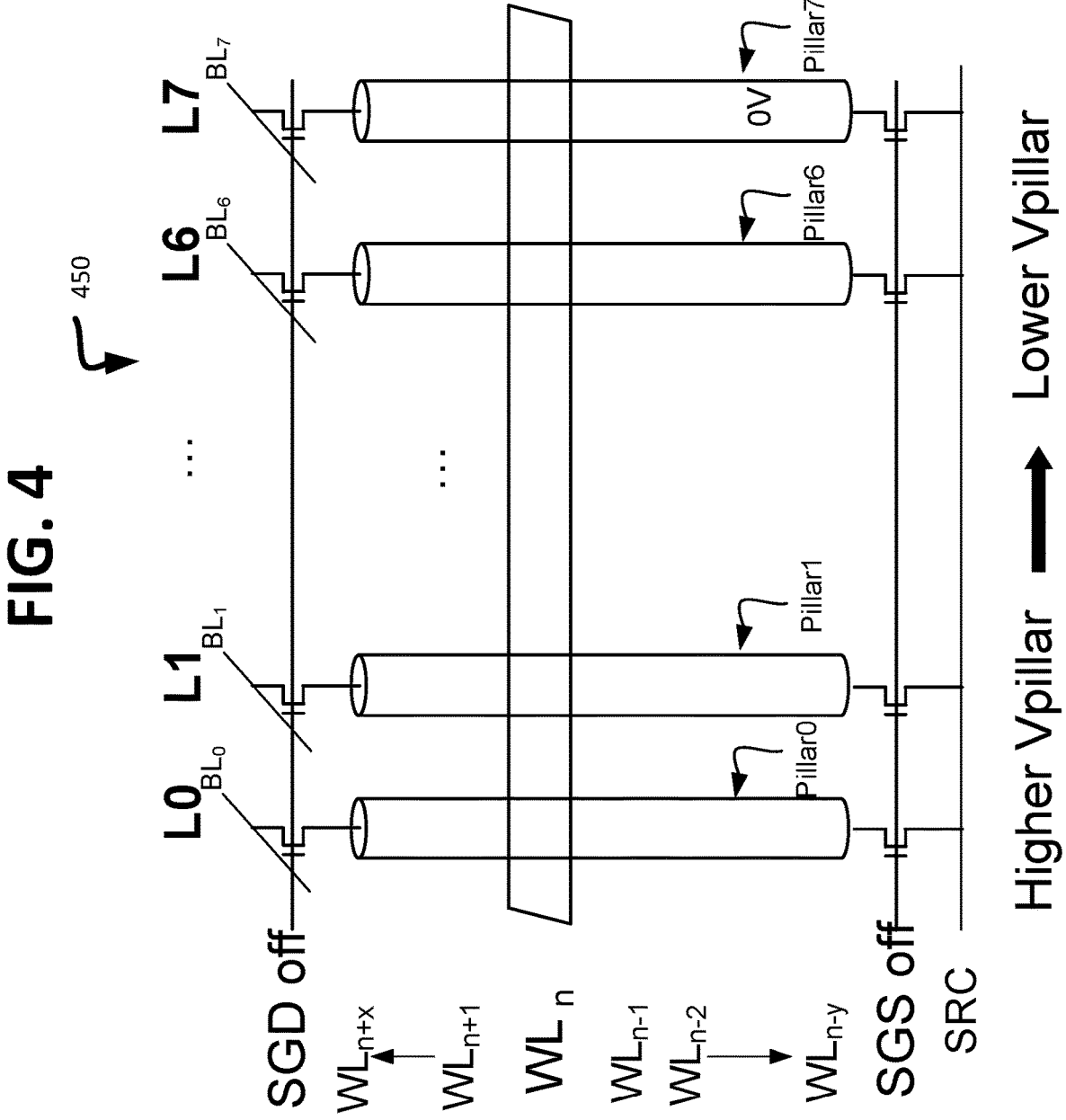
FIG. 4 illustrates an example memory array including wordlines and bitlines corresponding to multiple programming levels to be programmed according to a voltage adjusted all levels programming operation, in accordance with one or more embodiments of the present disclosure.

FIG. 4 illustrates an example set of pillars in an example memory array 450 including memory cells to be programmed using an all levels programming algorithm. As shown in FIG. 4, the example memory array 450 of a TLC memory device includes wordlines (e.g., a target wordline (WLn), a first set of unselected wordlines (e.g., WLn−1 and WLn+1 to WLn+x), a second set of unselected wordlines (e.g., WLn−2 to WLn−y) and a set of bitlines (e.g., BL0 to BL7) corresponding to an erase level (L0) and multiple programming levels (L1, . . . L7) to be programmed according to an all levels programming operation in accordance with one or more embodiments of the present disclosure. As shown in FIG. 4, the memory array 450 may be arranged in rows (each corresponding to a wordline) and columns (each corresponding to a bitline), wherein the intersection of a wordline and bitline constitutes the address of the memory cell. Each column may include a string of series-connected memory cells connected (e.g., selectively connected) to a common source (SRC). The common source can be coupled to a reference voltage (e.g., ground voltage or simply "ground" (Gnd) or a voltage source (e.g., a charge pump circuit or power supply which may be selectively configured to a particular voltage suitable for optimizing a programming operation, for example). A string of memory cells may be connected in series between a first select transistor (e.g., a source-side select transistor) referred to as a source select gate (SGS) and a second select transistor (e.g., a drain-side select transistor) referred to as a drain select gate (SGD). The source select transistors may be commonly connected to a first select line (e.g., a source select line) and the drain select transistors may be commonly connected to a second select line (e.g., a drain select line).

As shown in FIG. 4, the memory array 450 includes a set of pillars (e.g., Pillar0, Pillar1 . . . Pillar7) corresponding to substantially vertical strings of series coupled memory cells of the memory array 450. In an embodiment, the pillars refer to the channel regions (e.g., composed of polysilicon) of the access transistors of a vertical string of memory cells. According to embodiments, each of the pillars are floated and a corresponding voltage is boosted at different voltage levels (Vpillar) at different times by turning the source-side select transistor (SGS) and the drain-side select transistor (SGD) off. In an embodiment, the channel region is first discharged to ground before being floated and boosted to a particular voltage.

In an embodiment, as the ramping wordline voltage is applied, each of the pillars of a set of pillars (e.g., Pillar1 to Pillar6 in FIG. 4) are floated in sequence. With reference to FIG. 4, in an embodiment, a voltage of the pillar corresponding to the erase state (Pillar0) is floated prior to the application of the ramping wordline voltage. For example, Pillar 1 is floated at a first time during application of the ramping wordline voltage, Pillar 2 is floated at a second time during application of the ramping wordline voltage, and so on.

In an embodiment, while a respective pillar is in the floated state, a voltage corresponding to that pillar is boosted by the ramping wordline voltage. For example, Pillar 1 is floated at a first time and is boosted to a pillar voltage level corresponding to each increase of the ramping wordline voltage (e.g., each time the ramping wordline voltage is stepped). In this example, since Pillar 1 is floated at a first time, the corresponding pillar voltage (e.g., Vpillar1) is boosted multiple times in accordance with each increase of the ramping wordline voltage until the end of the wordline ramping phase (e.g., the first phase) of the all levels programming operation. In an embodiment, once a respective pillar is floated, a voltage of each pillar (Vpillar) can be boosted or increased in accordance with a step or increase of a ramping wordline voltage (also referred to as a wordline boost voltage or Vboost), as described in greater detail with respect to FIG. 6.

Figure 5:
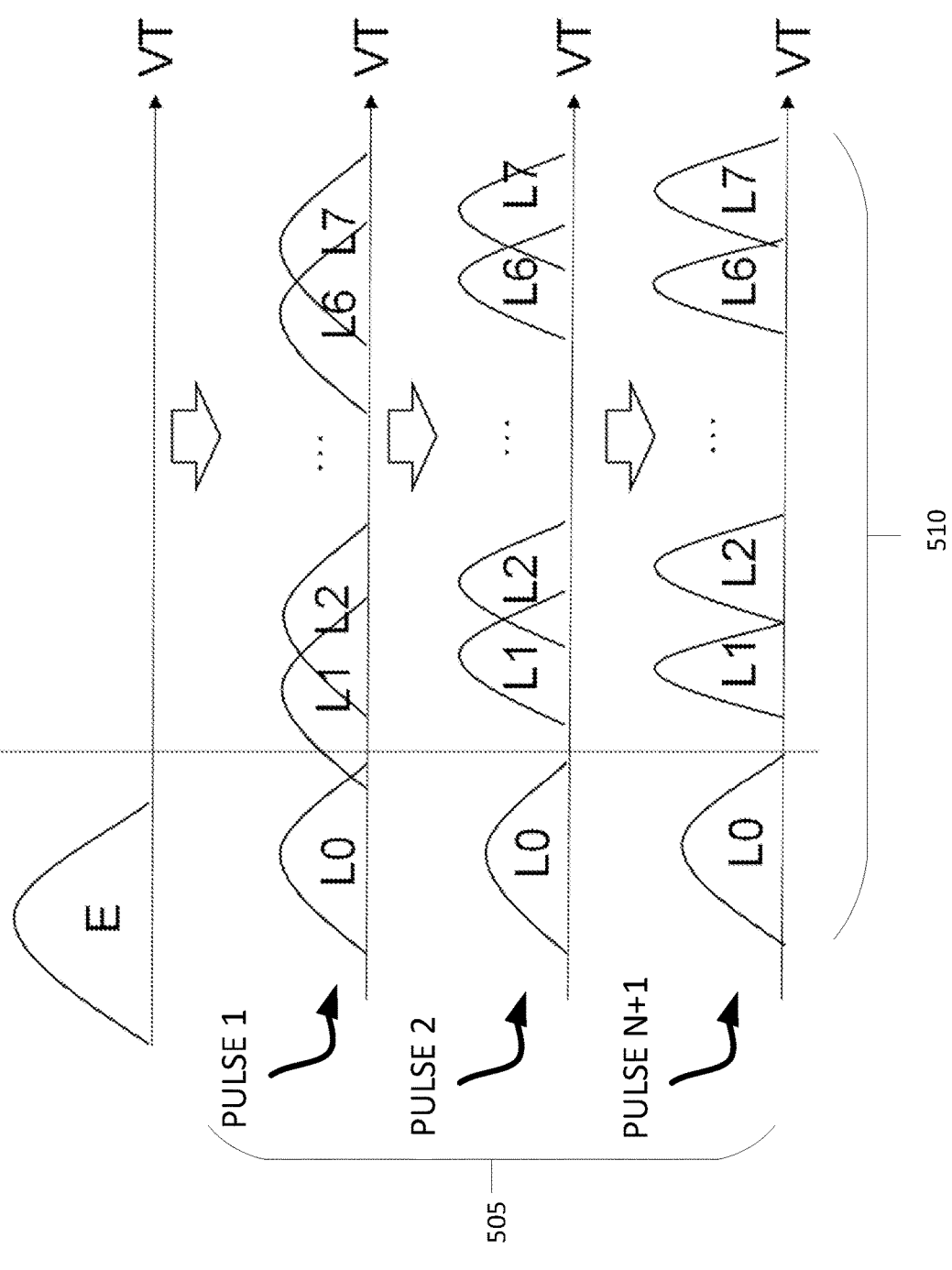
FIG. 5 illustrates an example set of programming pulses applied in a voltage adjusted all levels programming of a memory device in a memory sub-system, in accordance with one or more embodiments of the present disclosure.

FIG. 5 illustrates an example set of multiple pulses 505 (e.g., pulse 1, pulse 2 . . . pulse N+1) applied during the second phase of the all levels programming operation to program all programming levels (e.g., L1, L2, . . . L7) of the identified set of memory cells of the memory array with each programming pulse, according to embodiments of the present disclosure. As shown in FIG. 5, each respective pulse (e.g., Pulse 1, Pulse 2 . . . and Pulse N) is used to program each of programming levels (e.g., L1 to L7) of a memory device in a memory sub-system in accordance with one or more embodiments of the present disclosure. In an embodiment, each pulse programs an entire set of program levels 510 (e.g., all levels) of the memory cells together. In an embodiment, the set of pulses 505 are applied to a target wordline (e.g., $WL_n$) associated with the set of memory cells to be programmed. In an embodiment, for each pulse of the set of pulses applied, a program verify operation can be performed for each programming level to verify that target voltage corresponding to each respective programming level has been reached.

Figure 6:
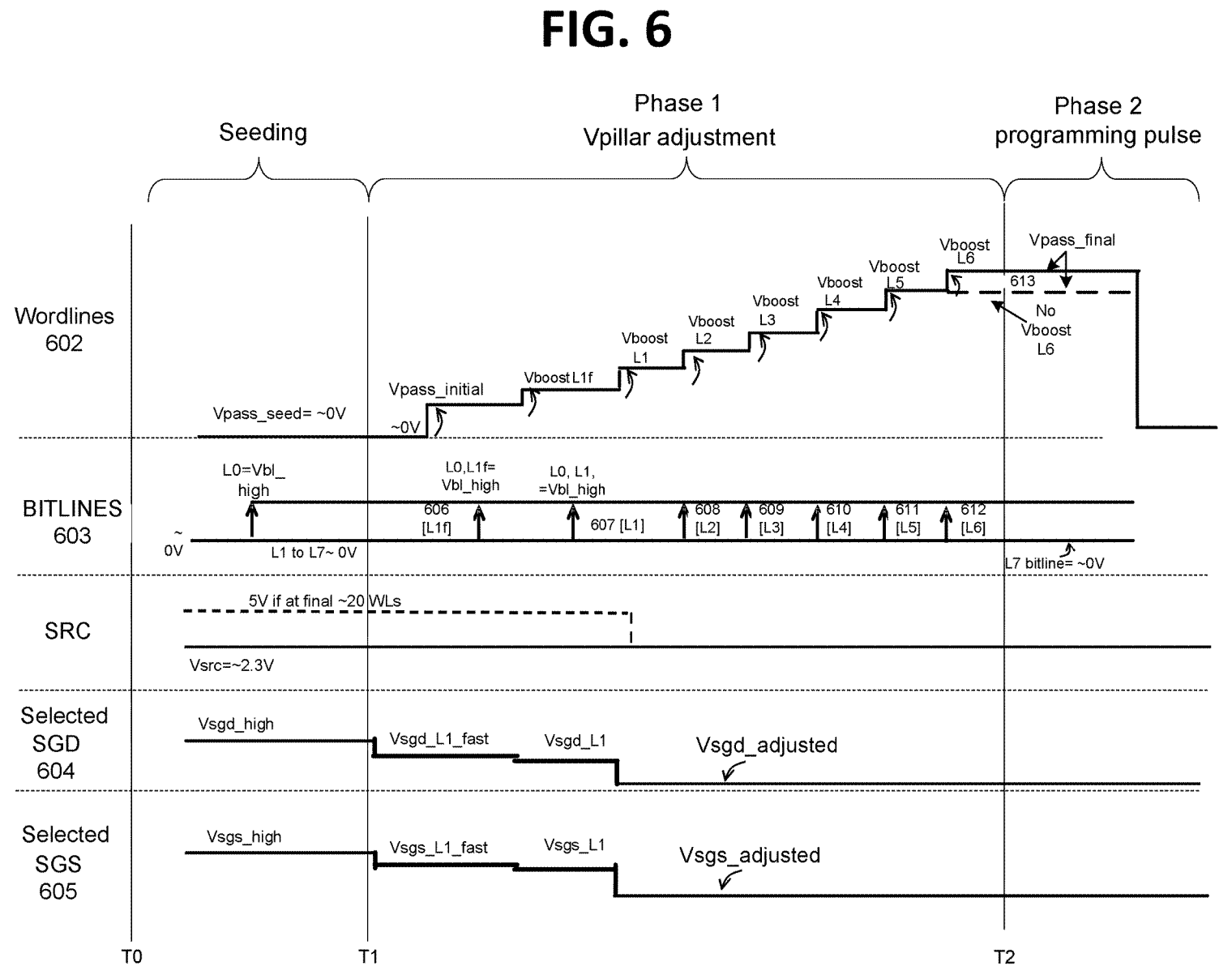

FIG. 6 illustrates example voltage waveforms of various portions of a memory array during execution of an all level programming process including pillar voltage control by adjusting one or more select gate voltage levels (e.g., Vsgd, Vsgs, or both) to enable select gate leakage and manage a final pass through voltage level (Vpass_final) during a first phase (i.e., a pillar voltage adjustment phase or Phase 1) of an all levels programming operation, according to embodiments of the present disclosure. In an embodiment, during the pillar voltage (Vpillar) adjustment phase, the voltage applied to the selected SGD 604 is adjusted (e.g., lowered) to Vsgd_adjusted to cause SGD leakage and control an amount of bitline voltage (Vbl) leaks to the pillars. In an embodiment, during the pillar voltage (Vpillar) adjustment phase, the voltage applied to the selected SGS 605 is adjusted (e.g., lowered) to Vsgs_adjusted to cause SGS leakage and control an amount of bitline voltage (Vbl) leaks to the pillars. According to embodiments, controlling of the leakage using Vsgs_adjusted and/or Vsgd_adjusted results in a reduction of the final Vpass level (Vpass_final), which reduces the program disturb.

According to an embodiment, the wordline boost (Vboost) for one or more pillars (e.g., L6 and L7) can be removed, such that the wordline voltage is not boosted or increased during adjustment of the L6 pillar and the L7 pillar. In this embodiment, the wordline voltage level applied during the boosting of the L5 pillar remains the same when boosting the L6 pillar and the L7 pillar. According to this embodiment, the wordline boost or step-up increment (e.g., Vboost=–1V) is not added to a current wordline voltage level (Vwl) when boosting the L6 pillar and the L7 pillar. Accordingly, since the wordline boost voltage is not added for boosting L6, the wordline voltage applied during the L6 boosting (Vwl_L6) is the same as the wordline voltage applied during the L5 boosting (Vwl_L5). According to embodiments, the removal of the Vboost for L6 and L7 reduces the overall or final pass through voltage (Vpass_final) associated with the all levels programming operation, which reduces the program disturb and associated drifting of the erase distribution (L0) in the direction of the first programming level (L1).

According to embodiments, the all levels programming process includes establishing (e.g., setting or adjusting) select gate (e.g., Vsgd and/or Vsgs) and wordline boost voltages (herein referred to as a "voltage-adjusted all levels programming operation" or a "voltage-adjusted all levels programming process") including adjusting the one or more select gate voltages and/or wordline boost voltages during the pillar voltage adjustment phase (e.g., Phase 1), as shown in FIG. 6). FIG. 6 illustrates the waveforms corresponding to the application of the voltage-adjusted all level programming operation.

With reference to FIG. 6, in an embodiment, the portions of the memory array include a set of memory cells associated with a target wordline of a set of wordlines 601 and portions of corresponding voltage waveforms resulting from execution of the voltage-adjusted all levels programming operation (such as the operations of method 700, described in greater detail below), according to embodiments of the present disclosure. In an embodiment, the processing logic identifies a set of memory cells to be programmed by an all levels programming operation (e.g., a target wordline of wordlines 601). In an embodiment, the all levels programming operation includes a seeding phase (e.g., time T0 to T1, preceding the pillar voltage adjustment phase (e.g., Phase 1)) where a first seeding voltage is applied to the selected SGD 604 (Vsgd_high) and a second seeding voltage is applied to the selected SGS 605 (Vsgs_high) to seed one or more pillars of the memory device. In an embodiment, Vsgd_seed is approximately 6.5V and Vsgs_high is approximately 7.5V. In an embodiment, during the seeding phase, the pillar associated with the erase level (L0) is floated, a bitline 603 corresponding to L0 is set to Vbl_high, and a selected SGD 604 is set to Vsgd_high.

During Phase 1 (e.g., from time T1 to time T2), a ramping wordline voltage is applied to the set of wordlines 601. For example, as shown in FIG. 6, a ramping wordline voltage is applied to wordline 601 where the voltage is incrementally ramped using a wordline voltage boost (Vboost) from an initial pass through voltage level (Vpass_initial) to a final pass through voltage level (Vpass_final) between T1 and T2. While the ramping wordline voltage is applied, a set of pillars corresponding to different programming levels are sequentially floated (e.g., by uncoupling the set of pillars).

With reference to FIG. 6, at the end of the first phase, the pillar voltage levels (Vpillar) are boosted to different voltage levels (e.g., Vpillar for programming level L1 is boosted to a highest value, Vpillar for programming level L2 is boosted to a next highest value and so on, where the Vpillar for programming level L0 remains approximately 0V during the first phase).

As shown in FIG. 6, between time T1 and T2, a first ramp of the ramping wordline voltage (e.g., from approximately 0V to value 1, in accordance with the boost or step voltage) is applied. During a time between T1 and T2, the ramping wordline voltage is applied to a first pillar (e.g., Pillar1 of FIG. 4) corresponding to programming level L1. In an embodiment, the voltage of Pillar1 (Vpillar1) is discharged through the bitline 603 corresponding to L1 which is set to ground (e.g., approximately 0V).

In an embodiment, a selected SGD 604 and the voltage levels of the bitlines 603 can be used to float the pillars in sequence and boost the corresponding pillar voltages (e.g., Vpillar) when each respective pillar is in the floating state. As shown in FIG. 6, a voltage level applied to a selected SGD 604 ($V_{SGD}$) is a high source voltage level (Vsgd_high). In an embodiment, as shown in FIG. 6, in order to float the first pillar (e.g., Pillar1 of FIG. 4) corresponding to programming level L1, in accordance with toggling a bitline voltage for a set of fast programming memory cells of L1 (L1f) from approximately 0V to Vbl_high (as illustrated by arrow 606) and the toggling of the bitline voltage for the remaining portion of L1 (L1) from approximately 0V to Vbl_high (as illustrated by arrow 607), the voltage of the selected SGD 604 can be adjusted from Vsgd_high to Vsgd_L1_fast and Vsgd_L1, respectively.

In an embodiment, as shown in FIG. 6, in order to float the first pillar (e.g., Pillar1 of FIG. 4) corresponding to programming level L1, in accordance with toggling the bitline voltage for the fast programming memory cells of L1 (L1f) from approximately 0V to Vbl_high (as illustrated by arrow 606) and the toggling of the bitline voltage for the remaining portion of L1 (L1) from approximately 0V to Vbl_high (as illustrated by arrow 607), the voltage of the selected SGS 605 can be adjusted from Vsgs_high to Vsgs_L1_fast and Vsgs_L1, respectively.

In an embodiment, toggling the respective bitlines from ground (e.g., 0V) to a high voltage (Vbl_high), as illustrated by the arrows 606, 607, 608, 609, 610, 611, and 612 is used to float the respective pillars (e.g., the pillars associated with L1f, L1, L2, L3, L4, L5, and L6, respectively) and can be boosted in accordance with the wordline ramping level at the time of the floating. In an embodiment, Pillar1 is floated when the voltage of the bitline (Vbl) is greater than or equal to $V_{SGD}$).

In the example shown in FIG. 6, the Vpillar1 is boosted while Pillar1 is floated (e.g., in the floating state) and exposed to a longest relative duration of the application of the ramping wordline voltage to the target wordline, wherein the ramping wordline voltage is periodically increased or stepped by a wordline step voltage level. In this example, the Vpillar1 remains floating from the time of the bitline toggling 607 to the end of the first phase (e.g., in view of the setting of the corresponding bitline to Vbl_high) and is repeatedly boosted by the ramping wordline voltage each time the wordline voltage is boosted, ramped, or increased. At the end of phase 1, Vpillar1 is boosted by the wordline step voltage (or a preset boost ratio of the wordline step voltage). For example, the Vpillar1 is boosted to value 7 (e.g., approximately 7V) after completion of the first phase (e.g., Vpillar1=[total ramping wordline voltage (e.g., approximately 8V)]–[the wordline voltage level at the time Vpillar1 is floated (e.g., 1V)]).

For example, as shown in FIG. 6, increasing the L1 bitline voltage level from approximately 0V to Vbl_high (as illustrated by arrows 606 and 607), the bitline voltage level (e.g., $V_{BL}$) is greater than the corresponding Vsgd (e.g., Vsgd_L1_fast and Vsgd_L1), resulting in Pillar1 remaining in a floating state and subject to boosting by the ramping wordline voltage until the end of the first phase.

As shown in FIG. 6, the floating of respective pillars continues for each of the set of pillars (e.g., pillars corresponding to L1 to L6) to enable each Vpillar to be boosted in accordance with the ramping wordline voltage. In an embodiment, since the pillars are floated in sequence (e.g., Pillar1 is floated before Pillar2, Pillar2 is floated before Pillar3, and so on), the respective pillar voltages are boosted from higher levels to lower levels moving from left to right (e.g., as shown in FIG. 4). In this regard, Vpillar1 is higher than Vpillar2, Vpillar2 is higher than Vpillar3, and so on as a function of the time when each pillar is floated. In an embodiment, the Vpillar for a floated pillar is boosted to a higher voltage level each time the ramping wordline voltage increases. As such, pillars that are floated earlier are boosted by a greater number of wordline ramping increases.

In an embodiment, during the first phase, the operations described can be repeated as part of the all levels programming process to float the pillars to move or adjust the corresponding Vpillar levels for each of the remaining programming levels (e.g., L3 to L7 for a TLC memory device). For example, as shown in FIG. 6, the L6 bitline toggles from ground (e.g., approximately 0V) to Vbl_high, as illustrated by the arrow 612. In an embodiment, L7 remains at ground (e.g., approximately 0V) (i.e., is not toggled).

According to an embodiment, L0 through L7 are approximately 8V (or higher), 6V, 5V, 4V, 3V, 2V, 1V, 0V, respectively. In an embodiment, Vpillar of L0 is equal to Vpass (e.g., between 8V and 10V). In an embodiment, there is a gap between Vpillar of L0 and the Vpillar of L1 (e.g., a gap of 2V or higher). In an embodiment, since Vpillar of L7 is approximately 0V, 1V can be added for each level such that the Vpillars of L1 through L7 are 6V through approximately 0V.

In an embodiment, at the end of the first phase (e.g., at Tpulse), the wordlines 601, are ramped to a final pass voltage level (Vpass_final). In an embodiment, in order to reduce the final pass through voltage level (Vpass_final), Vsgd is adjusted to Vsgd_adjusted during the Vpillar adjustment phase. In an embodiment, Vsgd_adjusted is adjusted to a level that is less than Vsgd_high, Vsgd_L1_fast, and Vsgd_L1. For example, Vsg_adjusted can be adjusted or lowered to a range of approximately 2.5V to approximately 0V.

In an embodiment, Vsgd is adjusted or lowered to Vsgd_adjusted to enable SGD leakage and control an amount of bitline voltage that leaks to the pillar, which reduces the final pass through voltage (Vpass_final). In an embodiment, the level of SGD leakage is represented by the following expression:

$$SGD \text{ leakage} = \text{Vsgd\_adjusted} - \text{Vsgd\_threshold},$$

where Vsgd_threshold represents the threshold voltage level associated with the SGD. Advantageously, controlling the SGD leakage enables the lowering of the Vpass_final level and reduces program disturb associated with the all levels programming operation.

In an embodiment, Vsgs is adjusted or lowered to Vsgs_adjusted to enable SGS leakage and control an amount of bitline voltage that leaks to the pillar, which reduces the final pass through voltage (Vpass_final). In an embodiment, the level of SGS leakage is represented by the following expression:

$$SGS \text{ leakage} = \text{Vsgs\_adjusted} - \text{Vsgs\_threshold},$$

where Vsgs_threshold represents the threshold voltage level associated with the SGS. Advantageously, controlling the SGS leakage enables the lowering of the Vpass_final level and reduces program disturb associated with the all levels programming operation.

In an embodiment, both Vsgd and Vsgs are adjusted during the Vpillar adjustment phase (e.g., Phase 1) of the all levels programming operation to Vsgd_adjusted and Vsgs_adjusted, respectively. The adjustment or lowering to the Vsgd_adjusted and Vsgs_adjusted levels during the pillar voltage adjustment phase is used to reduce the final pass through voltage (Vpass_final) and reduce the program disturb.

In an embodiment, the boost or step voltage increase associated with boosting the pillar voltage associated with the second to last pillar (L6) is removed. In this embodiment, as represented by the dashed line 613 in FIG. 6, no Vboost is applied for L6, thereby resulting in a lower Vpass_final, as compared to a final pass through voltage resulting from the boosting of the L6 pillar. In this embodiment, the Vboost level associated with L5 is applied to the boosting of L6, since no L6 boost or increment is added. The removal or elimination of the L6 boost provides for further control of the reduction to the Vpass_final. In an embodiment, the control logic can cause the boosting of a first subset of the programming levels (e.g., L0 to L5), while not increasing or stepping the boost voltage level during the adjustment of L6 and L7. In this embodiment, as indicated by the dashed line 613, the wordline ramping voltage applied during the boosting of L5, L6, and L7 is the Vboost L5 level, since no increment or increase is applied during the boosting of L6 and L7.

As shown in FIG. 6, at the completion of the first phase of the voltage adjusted all levels programming operation, a second phase is executed wherein a respective programming pulse is applied to program all of the programming levels. In an embodiment, a programming voltage (Vpgm) of each pulse is applied to the selected wordline to program each of the levels (L1 to L7 of a TLC memory device). As described above, different Vpillars are setup during the first phase depending on the corresponding target data level. In an embodiment, different $V_{stresslevels}$ are applied on the memory cells of L1 to L7.

FIG. 7 is a flow diagram of an example method 700 of a voltage-adjusted all levels programming of a memory device in a memory sub-system in accordance with some embodiments of the present disclosure. The method 700 is described with reference to FIGS. 1A-6. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by program manager 134 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, an operation is initiated. For example, control logic (e.g., program manager 134) can initiate the execution of an all levels programming operation including a first phase including applying a ramping voltage level to a set of wordlines of the memory device to boost a set of pillar voltages and a second phase including applying a set of programming pulses to a wordline associated with one or more memory cells of the memory array to be programmed to a set of programming levels, wherein each programming level of the set of programming levels is programmed by each programming pulse; and In an embodiment, during the first phase of the all levels programming operation, respective pillars (e.g., vertical conductive traces of the memory array) corresponding to programming levels (e.g., L1 to L6 for a TLC memory device) are floated (e.g., disconnected from both a voltage supply and a ground). In an embodiment, the set of pillars corresponding to different programming levels are floated in sequence during the first phase (e.g., a first pillar corresponding to L1 is floated at a first time, a second pillar corresponding to L2 is floated at a second time, and so on).

In an embodiment, the pillars refer to the channel regions (e.g., composed of polysilicon) of the access transistors of a vertical string of memory cells. In an embodiment, by floating each pillar associated with a respective programming level at different times during the first phase of the voltage-adjusted all levels programming operation, each pillar is exposed to a different length of the wordline voltage ramp process while in the floating state. In an embodiment, as a result each pillar is boosted to a different voltage as a function of the different exposure times associated with the ramping wordline voltage. For example, a first pillar that is floated first in sequence is exposed to a longest relative length of time of the wordline voltage and, as such, is boosted to a highest voltage level, a second pillar that is floated second in sequence is exposed to a next longest relative length of time of the wordline voltage and, as such, is boosted to a next highest voltage level, and so on.

In an embodiment, once floated, a voltage of each pillar (Vpillar) can be periodically boosted or increased in accordance with each step or increase of the ramping wordline voltage (e.g., each step of the ramping wordline voltage increases or boosts the pillar voltage for a pillar that is floating). At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains approximately 0V during the first phase).

In an embodiment, in the second phase of the all levels programming operation, the control logic causes a programming pulse to be applied to the set of memory cells, where the programming pulse programs each programming level of the set of programming levels associated with the identified set of memory cells. For example, the control logic can cause a programming pulse to be applied to the set of memory cells (e.g., the set of memory cells of memory array 150 of FIG. 1B), wherein the programming pulse programs all programming levels associated with the identified set of memory cells. In an embodiment, the programming pulse can be applied to the one or more target wordlines associated with the set of memory cells to be programmed, where the programming pulse programs each of the programming levels together (e.g., programming levels L1 to L7 are programmed using the programming pulses). In an embodiment, the boosting of the pillar voltages during a first phase enables the programming of all of the programming levels together using each programming pulse, the memory cells of the respective programming levels can be raised to the corresponding target voltage level in quicker and more efficient manner.

In an embodiment, the first phase and second phase of the all levels programming operation can be iteratively executed (e.g., phase 1 and phase 2 shown in FIG. 6 are iteratively performed). For each pulse of the set of pulses, a program verify operation can be performed for each programming level to verify that target voltage corresponding to each respective programming level has been reached.

At operation 720, a voltage adjustment is made. For example, during the first phase of the program operation, the control logic adjusts a first voltage applied to a drain-side select line (SGD) from a first SGD voltage level to a second SGD voltage level. In an embodiment, the first SGD voltage level is greater than the second SGD voltage level. In an embodiment, reducing the SGD voltage causes SGD leakage which can be used to control an amount of bitline voltage that can leak to the pillar. Advantageously, leakage of the bitline voltage to the pillar causes a reduction in the final pass through voltage associated with the voltage-adjusted all levels programming operation.

In an embodiment, during the first phase of the program operation, the control logic adjusts a second voltage applied to a source-side select line (SGS) from a first SGS voltage level to a second SGS voltage level. In an embodiment, the first SGS voltage level is greater than the second SGS voltage level.

Advantageously, the voltage adjusted all levels programming operation (e.g., the adjusting of one or more of the SGD voltage, the SGS voltage, and the boost voltage associated with pillar L6) results in a reduction of programming time while controlling or limiting the pass through voltage used during the programming operation. The programming time is reduced by performing fewer programming pulses, as compared to other programming algorithms such as ISPP. In an embodiment, the total programming time associated with the voltage adjusted all levels programming operation includes a time corresponding to performing the wordline ramping (e.g., performing six wordline ramps), a set of programming pulses to program each programming level together (e.g., six pulses) and a set of program verify operations (e.g., forty-two program verify operations, wherein a program verify operation is performed for each level (e.g., seven levels) for each pulse (e.g., six pulses). This results in a significant reduction in Tprog, less energy per bit, and a wordline peak current reduction. In addition, in an embodiment, the program verify operations are performed for each program pulse and each programming level, therefore no program verify skipping is needed. This simplifies the control of the memory sub-system and achieves verified target programming levels. Accordingly, the overall quality of service level provided by the memory sub-system is improved.

Figure 8:
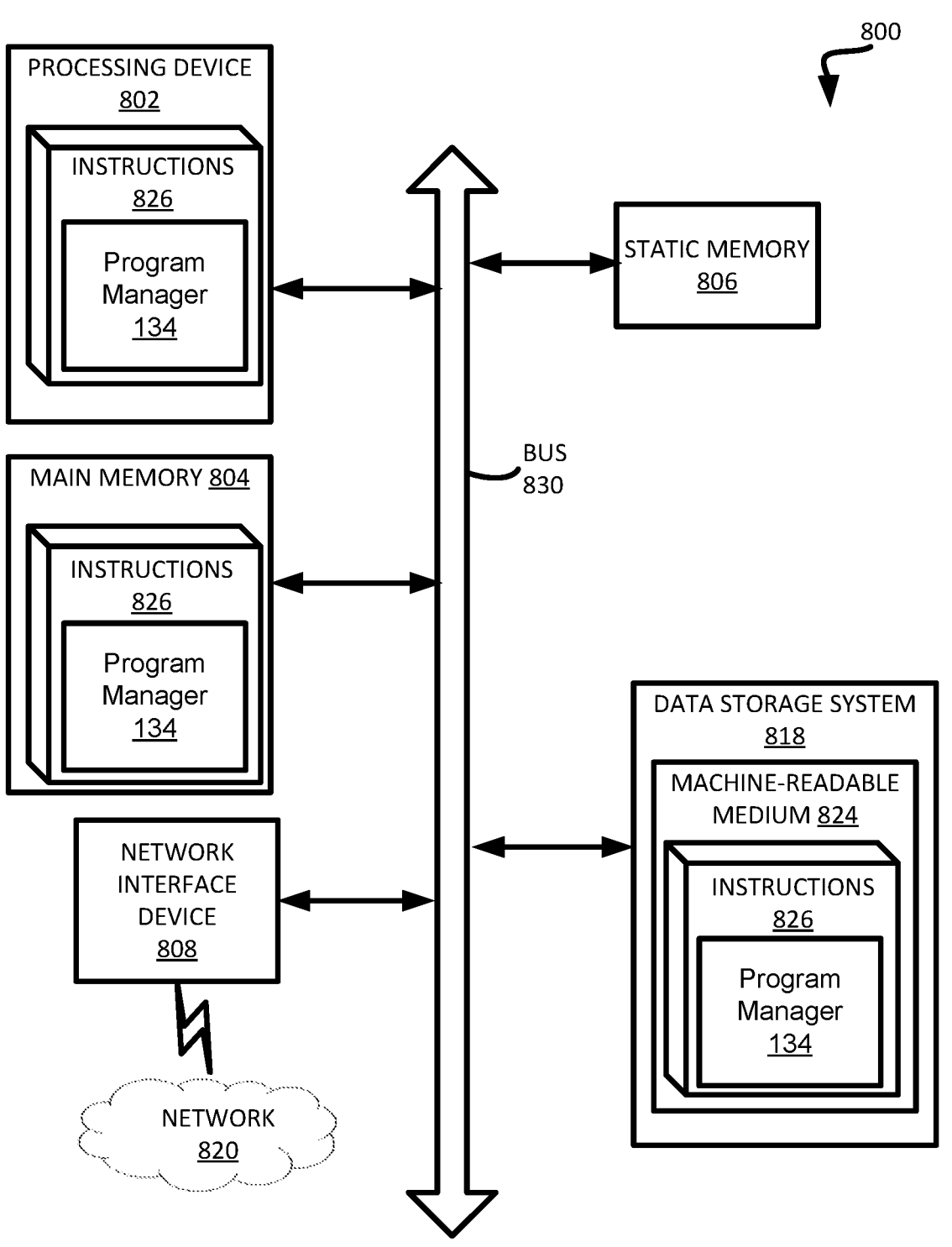
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to program manager 134 of FIGS. 1A and 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1A.

In one embodiment, the instructions 826 include instructions to implement functionality corresponding to program manager 134 of FIGS. 1A and 1B). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a plurality of memory cells; and
control logic, operatively coupled with the memory array, to perform operations comprising:
initiating a program operation comprising a first phase comprising applying a ramping voltage level to a set of wordlines of the memory device to boost a set of pillar voltages and a second phase comprising applying a set of programming pulses to a wordline associated with one or more memory cells of the memory array to be programmed to a set of programming levels, wherein each programming level of the set of programming levels is programmed by each programming pulse of the set of programming pulses; and
during the first phase of the program operation, adjusting a first voltage applied to a drain-side select line (SGD) from a first SGD voltage level to a second SGD voltage level.

2. The memory device of claim 1, wherein the first SGD voltage level is greater than the second SGD voltage level.

3. The memory device of claim 1, wherein adjusting the first voltage applied to the SGD causes SGD leakage.

4. The memory device of claim 1, the operations further comprising, during the first phase of program operation, adjusting a second voltage applied to a source-side select line (SGS) from a first SGS voltage level to a second SGS voltage level.

5. The memory device of claim 4, wherein the first SGS voltage level is greater than the second SGS voltage level.

6. The memory device of claim 1, the operations further comprising incrementing the ramping voltage level by a step voltage amount for a subset of the set of pillars.

7. The memory device of claim 6, wherein the ramping voltage level is not increased during boosting of a sixth pillar associated with a sixth programming level of the set of programming levels and a seventh pillar associated with a seventh programming level of the set of programming levels.

8. A method comprising:
initiating a program operation comprising a first phase comprising applying a ramping voltage level to a set of wordlines of a memory device to boost a set of pillar voltages and a second phase comprising applying a set of programming pulses to a wordline associated with one or more memory cells of the memory device to be programmed to a set of programming levels, wherein each programming level of the set of programming levels is programmed by each programming pulse of the set of programming pulses; and
during the first phase of the program operation, adjusting a first voltage applied to a drain-side select line (SGD) from a first SGD voltage level to a second SGD voltage level.

9. The method of claim 8, wherein the first SGD voltage level is greater than the second SGD voltage level.

10. The method of claim 8, wherein adjusting the first voltage applied to the SGD causes SGD leakage.

11. The method of claim 8, further comprising, during the first phase of program operation, adjusting a second voltage applied to a source-side select line (SGS) from a first SGS voltage level to a second SGS voltage level.

12. The method of claim 11, wherein the first SGS voltage level is greater than the second SGS voltage level.

13. The method of claim 8, further comprising incrementing the ramping voltage level by a step voltage amount for a subset of the set of pillars.

14. The method of claim 13, wherein the ramping voltage level is not increased during boosting of a sixth pillar associated with a sixth programming level of the set of programming levels and a seventh pillar associated with a seventh programming level of the set of programming levels.

15. A non-transitory computer-readable storage medium comprising instructions that, when executed by a processing device, cause the processing device to perform operations comprising:

initiating a program operation comprising a first phase comprising applying a ramping voltage level to a set of wordlines of a memory device to boost a set of pillar voltages and a second phase comprising applying a set of programming pulses to a wordline associated with one or more memory cells of a memory device to be programmed to a set of programming levels, wherein each programming level of the set of programming levels is programmed by each programming pulse of the set of programming pulses; and during the first phase of the program operation, adjusting a first voltage applied to a drain-side select line (SGD) from a first SGD voltage level to a second SGD voltage level.

16. The non-transitory computer-readable storage medium of claim 15, wherein the first SGD voltage level is greater than the second SGD voltage level.

17. The non-transitory computer-readable storage medium of claim 15, wherein adjusting the first voltage applied to the SGD causes SGD leakage.

18. The non-transitory computer-readable storage medium of claim 15, the operations further comprising, during the first phase of program operation, adjusting a second voltage applied to a source-side select line (SGS) from a first SGS voltage level to a second SGS voltage level.

19. The non-transitory computer-readable storage medium of claim 18, wherein the first SGS voltage level is greater than the second SGS voltage level.

20. The non-transitory computer-readable storage medium of claim 15, further comprising incrementing the ramping voltage level by a step voltage amount for a subset of the set of pillars, wherein the ramping voltage level is not increased during boosting of a sixth pillar associated with a sixth programming level of the set of programming levels and a seventh pillar associated with a seventh programming level of the set of programming levels.

* * * * *